US006081064A

United States Patent [19]

Pfeiffer et al.

[11] Patent Number: 6,081,064

[45] Date of Patent: Jun. 27, 2000

[54] ACOUSTIC TRANSDUCER SYSTEM

[75] Inventors: Helmut Pfeiffer, Steinen; Gerold Klotz-Engmann, Maulburg; Karl Flögel, Schopfheim, all of Germany

[73] Assignee: Endress + Hauser GmbH + Co., Maulburg, Germany

[21] Appl. No.: 09/217,033

[22] Filed: Dec. 21, 1998

[30] Foreign Application Priority Data

Dec. 30, 1997 [DE] Germany ........................... 197 58 243

[51] Int. Cl.[7] ......................... H02R 17/00; H01L 41/053

[52] U.S. Cl. ............................................ 310/334; 310/336

[58] Field of Search .................................... 310/322, 334, 310/336; 367/140

[56] References Cited

U.S. PATENT DOCUMENTS

| | | | |
|---|---|---|---|
| 3,525,071 | 8/1970 | Massa | 310/334 |
| 4,333,028 | 6/1982 | Panton | 310/326 |
| 4,768,615 | 9/1988 | Steinbrunner et al. | 181/157 |
| 5,191,796 | 3/1993 | Kishi et al. | 73/632 |
| 5,218,575 | 6/1993 | Cherek | 367/140 |
| 5,452,267 | 9/1995 | Spevak | 367/163 |
| 5,457,352 | 10/1995 | Muller et al. | 310/327 |
| 5,726,952 | 3/1998 | Eckert et al. | 367/140 |

FOREIGN PATENT DOCUMENTS

| | | | |
|---|---|---|---|
| 62-19900 | of 0000 | Japan | H04R 17/00 |
| 57-78299 | 5/1982 | Japan | H04R 7/02 |
| 2087688 | of 0000 | United Kingdom | H04R 7/00 |

*Primary Examiner*—Thomas M. Dougherty

*Attorney, Agent, or Firm*—Bose McKinney & Evans LLP

[57] ABSTRACT

The acoustic transducer system includes a flexural vibrating plate coupled to an electromechanical transducer and so configured that it is stimulated to higher order flexural vibrations at the system operating frequency, at which nodal lines form on the flexural vibrating plate between which first and second antinodal zones are located oscillating alternatingly opposite in phase. For influencing the sound radiation, in the second antinodal zones oscillating in phase with respect to each other and opposite in phase in relation to the first antinodal zones one mass ring each is arranged on the rear side of the flexural vibrating plate facing away from the transmission medium concentrically to the centerpoint of the flexural vibrating plate. Due to the increased mass the second antinodal zones oscillate at a substantially smaller amplitude than the first antinodal zones so that the sound waves opposite in phase generated by the first and second antinodal zones are unable to fully cancel each other out, as a result of which a radiation pattern materializes having a pronounced directivity in the direction perpendicular to the flexural vibrating plate.

22 Claims, 4 Drawing Sheets

ACOUSTIC TRANSDUCER SYSTEM

BACKGROUND OF THE INVENTION

The invention relates to an acoustic transducer system including an electromechanical transducer, a circular flexural vibrating plate coupled to the electromechanical transducer and so configured that it is stimulated to higher order flexural vibration at the system operating frequency, at which nodal lines form on the flexural vibrating plate between which first and second antinodal zones are located oscillating alternatingly opposite in phase so that the flexural vibrating plate emits sound waves into a transmission medium bordering one side of the flexural vibrating plate or is stimulated to flexural vibration by sound waves arriving via the transmission medium, and including means for influencing the sound radiation by the flexural vibrating plate.

Acoustic transducer systems of this kind are used more particularly as sound transmitters and/or sound receivers for echo ranging wherein the travel time of a sound wave emitted by a sound transmitter to a reflecting object and the travel time of the echo sound wave reflected by the object back to the sound receiver is measured. For the known speed of sound the travel time is a measure of the distance to be measured. The frequency of the sound wave may be in the audible range or in the ultrasonic range. In most cases ranging is done in accordance with the pulse delay method in which a short sound pulse is emitted and the echo pulse reflected by the object is detected. In this case the same acoustic transducer system may be used alternatingly as the sound transmitter and sound receiver.

One broad field of application of this sonic ranging technique is level sensing. For this purpose the acoustic transducer system is located above the material to be sensed, above the highest level of the material anticipated, so that it radiates a sound wave downwards onto the material and receives the sound wave reflected upwards from the surface of the material. The measured travel time of the sound wave then indicates the distance of the material surface from the acoustic transducer system, and for a known mounting level of the acoustic transducer system the level to be sensed may then be computed.

For sonic ranging over long distances high-performance acoustic transducer systems having a good efficiency are needed so that the intensity of the received echo signal is still sufficient for analysis. The efficiency depends mainly on two factors:

1. on how well the acoustic transducer system is adapted to the impedance of the transmission medium;
2. on the directivity of the acoustic transducer system in transmitting and receiving sound waves.

The flexural vibrating plates used in known acoustic transducer systems serve for impedance matching. In level sensing the transmission medium for the sound waves is gaseous, e.g. air, this also applying to many other fields of application. Conventional electromechanical transducers, such as piezoelectric transducers, magnetostrictive transducers, etc. have as a rule an acoustic impedance which is very different to that of air or other gaseous transmission media. This is why they serve in known acoustic transducer systems merely for stimulating the large surface area flexural vibrating plates forming the actual sound radiators or sound receivers and result in good impedance matching to air or other gaseous transmission media.

As regards the desired directivity large surface area flexural vibrating plates would appear to be likewise of advantage since it is known that pencilling a radiation lobe is the narrower the greater the extension of the radiation surface area in relation to the wavelength. This is hampered, however, by the problem that the antinodal zones oscillating alternatingly opposite in phase emit sound waves opposite in phase causing interference with each other in the case of acoustic transducer systems incorporating a flexural vibrating plate exhibiting higher order flexural vibration.

To avoid this unfavorable radiation pattern it is known from "The Journal of the Acoustical Society of America, Vol. 51, No. 3 (Part 2), pages 953 to 959, to configure the portions of the flexural vibrating plate corresponding to the antinodal zones alternatingly differing in thickness. This difference in thickness is so dimensioned that the sound waves emitted by the thicker portions receive a phase rotation through 180°. The sound waves radiated from all antinodal zones are then in phase so that the radiation pattern features a marked radiation maximum in the axial direction in the form of a pencilled lobe. Producing such a flexural vibrating plate is, however, complicated and expensive. Furthermore, the acoustic transducer system equipped with such a flexural vibrating plate has a very narrow band since phase rotation through 180° occurs only for a highly specific frequency as dictated by the structure of the flexural vibrating plate, this being the reason why it is not suitable for pulsed operation.

In an acoustic transducer system known from European Patent EP 0 039 986 the portions of the flexural vibrating plate corresponding to the alternating antinodal zones are likewise configured so that the sound waves generated by every second antinodal zone receive a phase rotation through 180°, resulting in the sound waves emitted from all antinodal zones being substantially in phase. For this purpose a low-loss acoustic propagation material is applied to the corresponding portions of the emitting surface area of the flexural vibrating plate in such a thickness that the desired phase rotation is achieved, closed cell expanded plastics materials or non-expanded elastomers being proposed as the low-loss acoustic propagation material used for this purpose. This material needs to be cut out corresponding to the shape of the antinodal zones and bonded to the flexural vibrating plate, thus resulting in problems when the acoustic transducer system is exposed in operation to mechanical stresses or chemical influences as is particularly the case in level sensing. The bonded plastics parts are susceptible to damage and are only weakly resistant to many chemically aggressive media. Furthermore, they increase the risk of encrustations of dusty, powdery or tacky material, this impairing reliable functioning.

In an acoustic transducer system known from German patent 36 02 351 a sonic beam shaper is provided to influence the sound emitted, comprising sound wave barriers which are impervious for sound waves, located spaced away from the flexural vibrating plate and acoustically decoupled therefrom in front of antinodal zones oscillating in phase relative to each other, whilst portions which are pervious for sound waves are located in front of the remaining antinodal zones oscillating opposite in phase relative to the former antinodal zones. The sonic beam shaper has the effect that only in-phase sound waves are radiated by the flexural vibrating plate whilst the sound waves opposite in phase thereto are suppressed by the sound wave barriers.

SUMMARY OF THE INVENTION

The object of the invention is to provide an acoustic transducer system of the aforementioned kind featuring good directivity whilst being highly insensitive to noise, soilage, encrustations and the effects of aggressive media.

This object is achieved in accordance with the invention in that in the second antinodal zones oscillating in phase with respect to each other and opposite in phase in relation to the first antinodal zones one mass ring each is arranged on the rear side of the flexural vibrating plate facing away from the transmission medium concentrically to the centerpoint of the flexural vibrating plate.

In the acoustic transducer system in accordance with the invention the mass rings arranged in the second antinodal zones oscillating in phase have the effect that these antinodal zones oscillate with a reduced amplitude, whilst at the same time the oscillation amplitude of the first antinodal zones oscillating opposite in phase to the second antinodal zones is increased. The sound waves emitted by the alternating antinodal zones, opposite in phase to each other and resulting in interference with each other thus greatly differ in amplitude so that the weaker sound waves are suppressed and only the sound waves in phase having a considerable intensity are propagated in the main direction of radiation perpendicular to the flexural vibrating plate. This results in a radiation pattern having a pronounced directivity in the main direction of radiation. In this arrangement the face side, exposed to the environment, of the acoustic transducer system is formed exclusively by the smooth and flat front side of the flexural vibrating plate whilst all means of influencing sound radiation are arranged on the rear side of the flexural vibrating plate, protected from the environment, this resulting in the acoustic transducer system being highly insensitive to soilage, encrustations and the effect of aggressive media. The acoustic transducer system is thus particularly suitable for use under rough environmental conditions as are encountered, more particularly, in industrial applications.

Advantageous aspects and further embodiments of the invention are characterized in the sub-claims.

BRIEF DESCRIPTION OF THE DRAWINGS

Further features and advantages of the invention read from the following description of example embodiments as shown in the drawings in which.

DETAILED DESCRIPTION OF THE PREFERRED EMBODIMENTS

Figure 1:
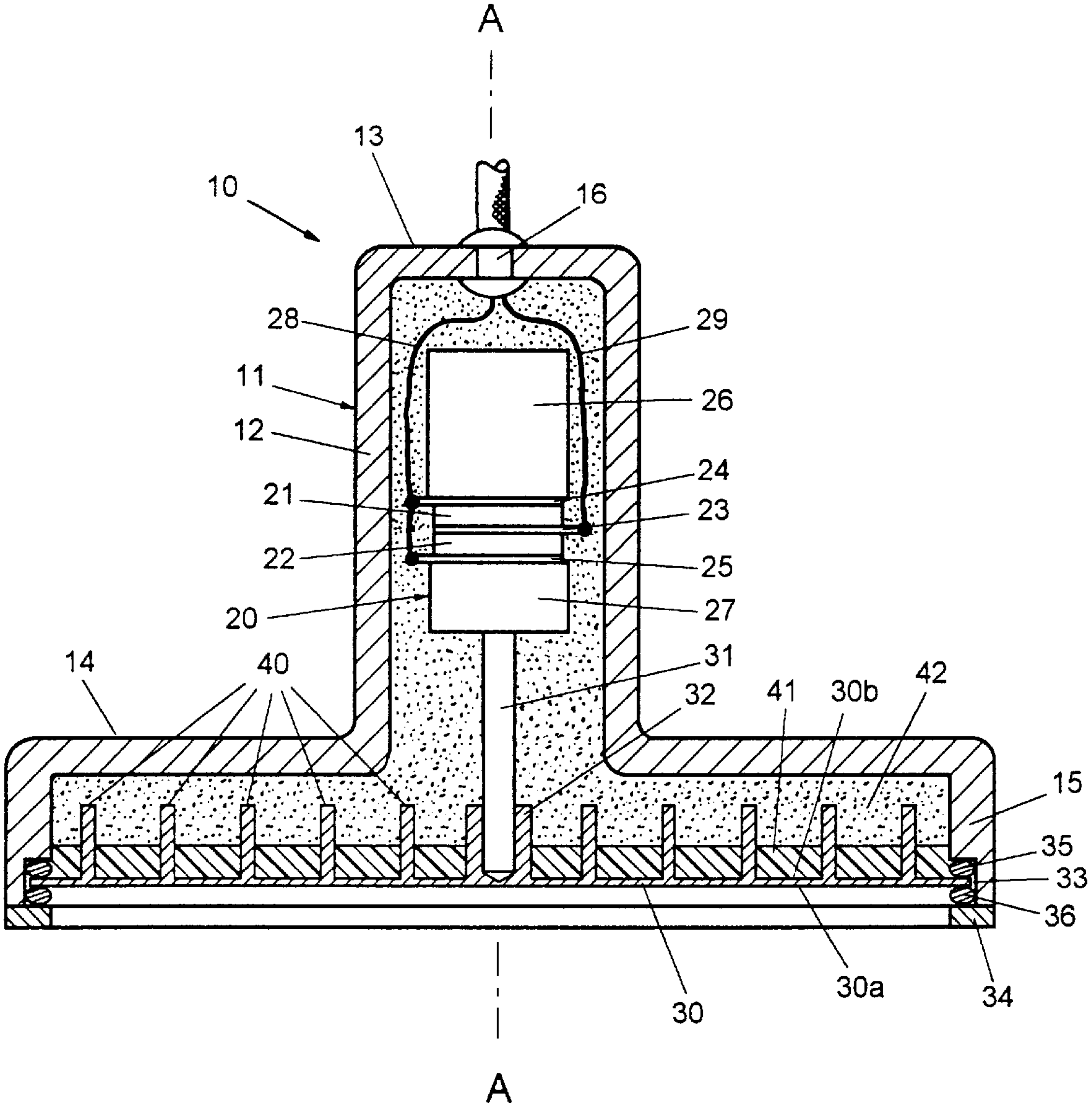
FIG. 1 is a schematic section view of an acoustic transducer system in accordance with the invention.

Referring now to FIG. 1 there is illustrated an acoustic transducer system 10 including a housing 11 having a tubular section 12 which is closed at one end by a bottom 13 and merges at the opposite open end into a flared section 14 having the shape of a shallow dish with a rim 15. Applied to an opening in the bottom 13 is a cable lead-through 16. The whole housing 11 is rotationally symmetric to its centerline A—A so that the rim 15 of the flared section 14 is right circular.

Arranged in the tubular section 12 is an electromechanical transducer 20 which in the example embodiment shown is a piezoelectric transducer, consisting of two piezo elements 21 and 22 located sandwiched between two outer electrodes 24, 25 with the insertion of a middle electrode 23. The sandwich block consisting of the piezo elements 21, 22 and the electrodes 23, 24, 25 is clamped in place between a supporting compound 26 and a coupling compound 27. The two outer electrodes 24 and 25 are electrically connected to a common lead 28. The middle electrode 23 is connected to a second lead 29. The two piezo elements 21, 22 are thus electrically connected in parallel whilst being located in series mechanically.

Arranged in the flat flared section 14 is a thin circular flexural vibrating plate 30 which is mechanically connected to the electromechanical transducer 20 by a rod 31. The rod 31 protrudes into the axial hole of a bushing 32 provided in the center of the flexural vibrating plate 30 and is fixedly connected thereto by suitable means, for instance, by being screwed, pressed, welded or soldered into place. The flexural vibrating plate 30 is located spaced away from the bottom of the flared housing section 14, the diameter of the flexural vibrating plate being slightly larger than the inner diameter of the rim 15 and slightly smaller than the inner diameter of a recess 33 formed in the face end of the rim 15. In the recess 33 the rim of the flexural vibrating plate 30 is clamped in place by means of a retaining ring 34 between two O-rings 35 and 36. The retaining ring may be secured in any suitable way to the rim 15, for example by being screwed, welded, soldered or bonded in place. The O-rings 35 and 36 serve to isolate structure-borne noise between the flexural vibrating plate 30 and the housing 11 whilst simultaneously preventing ingress of undesirable foreign matter into the interior of the housing 11 round about the rim of the flexural vibrating plate 30.

Figure 2:
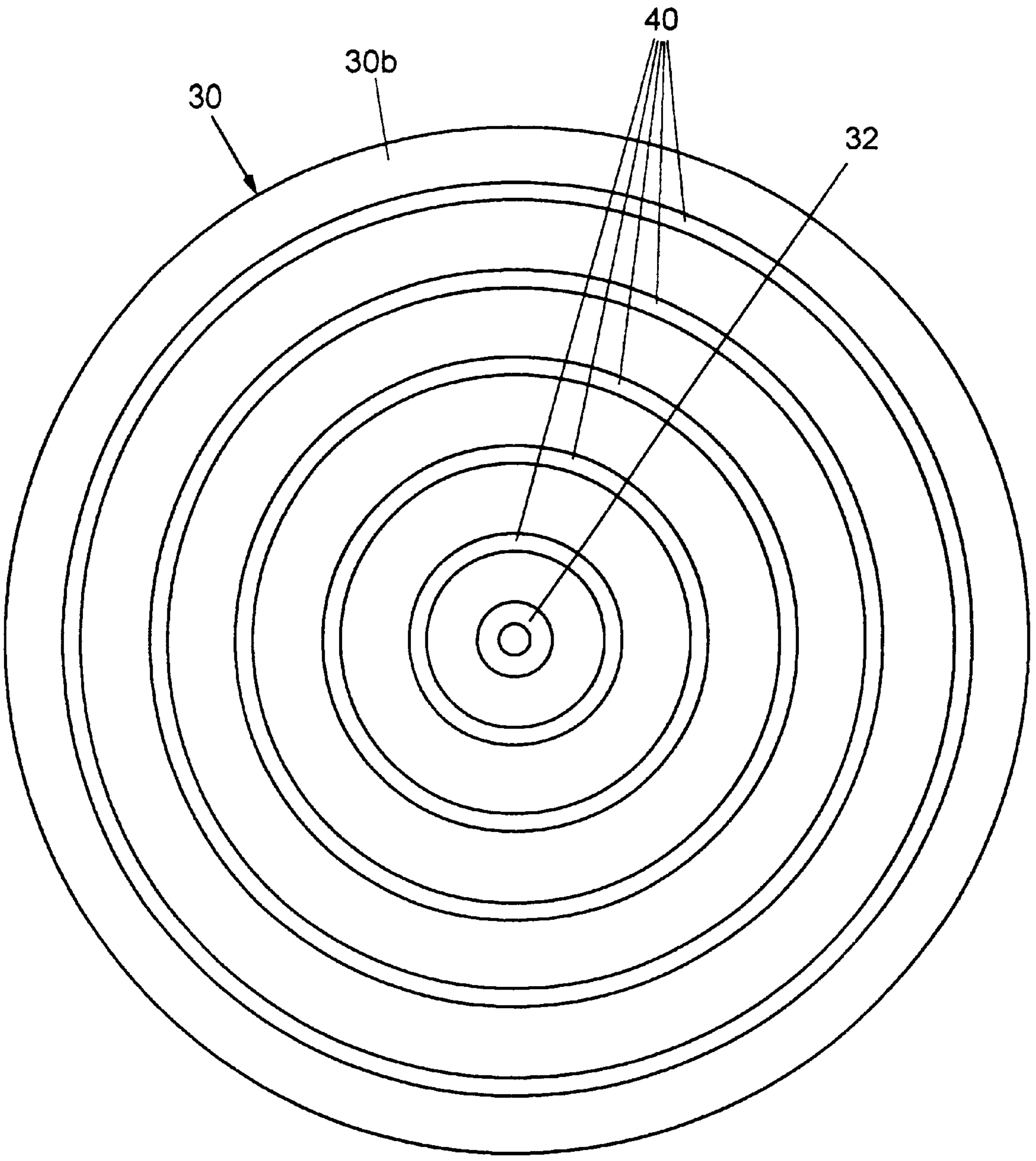
FIG. 2 is a plan view of the rear side, facing away from the transmission medium, of the flexural vibrating plate of the acoustic transducer as shown in FIG. 1.

The front side 30*a* of the flexural vibrating plate 30 in contact with the transmission medium (e.g. air) into which sound waves are to be radiated or from which sound waves are to be received is totally smooth and flat, whereas arranged on the rear side 30*b*, facing away from the transmission medium, of the flexural vibrating plate 30 located in the interior of the flared housing section 14 are circular concentric mass rings 40, these rings being evident in section in FIG. 1 and in a plan view on the rear side 30*b* of the flexural vibrating plate 30 from FIG. 2. The mass rings 40 may be connected to the flexural vibrating plate 30 by any suitable means. They may be fabricated, as evident from the embodiment as shown in FIG. 1, and just like the central bushing 32 in one piece with the flexural vibrating plate 30, for example, by being milled out of a solid metal plate. However, they may also be fabricated as separate parts which are then secured to the flexural vibrating plate 30, for example, by welding, soldering or bonding, in this case too, the mass rings 40 preferably being made of metal. The sections of the rear side 30*b* of the flexural vibrating plate 30 not occupied by the bushing 32 and the mass rings 40 are covered by an expanded plastics material 41, the thickness of which is less than the height of the mass rings 40. All of the remaining interior of the housing 11 is filled with a potting compound 42 consisting of a high-damping plastics material in which also the sections of the mass rings 40 protruding from the expanded plastics material 41 are embedded. The expanded plastics material 41 prevents the potting compound 42 from coming into contact with the flexural vibrating plate 30. The expanded plastics material 41 may consist for example of polyethylene or polybutadiene. For the potting compound 42 use may be made of the polyurethane-based two-component casting resin known by the name of "Nafturan" (trademark) or the silicone rubber known by the name of "Eccosil" (trademark).

The acoustic transducer system 10 as shown in FIG. 1 serves the purpose of converting electrical oscillations into sound waves transmitted in the direction of the centerline A—A, i.e. perpendicular to the plane of the flexural vibrating plate 30, or of converting sound waves coming from this direction into electrical oscillations. The transceiving direction as shown in FIG. 1 is located perpendicularly under the acoustic transducer system, this corresponding to the usual method of installation when the acoustic transducer system is employed as a kind of echo sounder for level sensing. In this application the acoustic transducer system is mounted above the highest level anticipated and the sound waves travel through the air downwards until they impact the surface of the material where they are reflected to return to the acoustic transducer system as an echo signal. The spacing between the surface of the material and the acoustic transducer system materializes from the travel time of the sound waves, it being from this spacing that the level may be computed. For measuring the travel time the sound waves are normally emitted in the form of short pulses and the delay until the echo pulses arrive is measured. In this case the acoustic transducer system as illustrated may be used alternatingly as the sound transmitter and as the sound receiver.

In other applications, for instance in ranging, the acoustic transducer system may of course be operated in any other direction as required.

In all cases, for achieving a long range with best possible efficiency, i.e. for receiving sufficiently strong echo signals with as low a transmission power as possible, two requirements need to be satisfied:

1. good adaptation of the acoustic transducer system to the acoustic impedance of the transmission medium, e.g. air;
2. good directivity, i.e. pencilling the sound wave beam as sharply as possible in the desired direction of transmission, i.e. in the direction of the centerline A—A.

To satisfy the first requirement the flexural vibrating plate 30 is used as sound radiator. When an electric alternating voltage is applied to the electrodes 23, 24, 25 via the leads 28, 29 the piezo elements 21, 22 execute thickness resonances which stimulate the coupling resonator tuned to the elements 26, 27 into longitudinal resonance vibrations which are transferred to the rod 31 causing it to execute longitudinal vibrations in the direction of the centerline A—A. The system operating frequency, i.e. the frequency of the electrical alternating voltage and thus the frequency of the mechanical vibration generated by the piezoelectric transducer is substantially higher than the flexural vibration natural resonance frequency of the flexural vibrating plate 30 so that the flexural vibrating plate 30 is excited by the rod 31 into higher order flexural vibration. The large surface area flexural vibrating plate 30 stimulated to higher order flexural vibration results in a good impedance matching to the transmission medium, i.e. air or any other gaseous transmission medium.

Satisfying the second requirement is the task of the mass rings 40 applied to the rear side 30*b* of the flexural vibrating plate 30. The function of the mass rings 40 and the effect they produce will now be discussed with reference to FIGS. 3 and 4.

Figure 3:
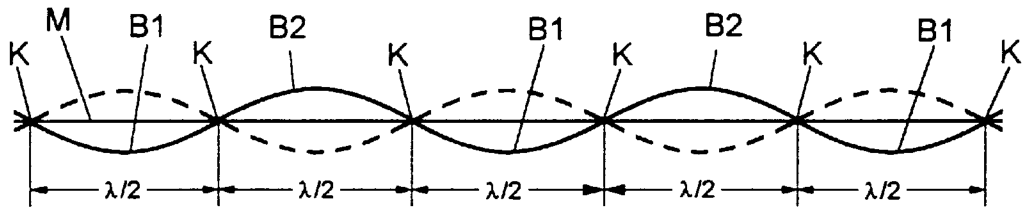
FIG. 3 is a schematic illustration for explaining the functioning of the flexural vibrating plate of a known kind of acoustic transducer system.

Referring now to FIG. 3 there is illustrated schematically the vibrational response of a section of a conventional type flexural vibrating plate stimulated into higher order flexural vibration, consisting of a thin metal plate smooth and flat on both sides and consistent in thickness. The straight line M identifies the center plane of the flexural vibrating plate in its resting position. In the stimulated condition concentric nodal lines K form on the flexural vibrating plate which remain during vibration in the resting position on the center plane M. The spacings of the nodal lines K are dictated by the system operating frequency; all nodal lines have the same spacing $\lambda/2$ from each other corresponding to half the wavelength of the standing flexural wave formed on the flexural vibrating plate 30 at the system operating frequency. Located between the nodal lines K are annular diaphragm sections forming alternating first antinodal zones B1 and second antinodal zones B2. All first antinodal zones B1 oscillate in phase. All second antinodal zones B2 oscillate likewise in phase, but opposite in phase to the first antinodal zones B1. The vibration condition of the antinodal zones B1 and B2 as evident from FIG. 3 at a point in time corresponding to the maximum deflection in one direction is represented by a solid line whilst the vibration condition at a point in time corresponding to the maximum deflection in the opposite direction, i.e. after a change in phase of 180° is represented by a broken line. The amplitudes of the deflections are of the same size for the antinodal zones B1 and B2, they being indicated exaggerated for better clarity.

Each antinodal zone produces a sound wave which is propagated in the adjoining transmission medium. As regards the desired directivity there is, however, the problem that the sound waves generated by neighboring antinodal zones are each opposite in phase, these sound waves alternatingly opposite in phase in the case of the conventional-type acoustic transducer system as shown in FIG. 3 being the same in amplitude so that they cancel each other out in the desired direction of propagation perpendicular to the plane M of the flexural vibrating plate. Such a sound wave distribution produces no pronounced directivity in the axial direction located perpendicular to the flexural vibrating plate; instead the directivity pattern features strong radiation side lobes located concentric to this axial direction and further weaker side blips. It is due to this poor directivity that the majority of the emitted acoustical energy is lost in particular over longish sensing distances, without being returned to the acoustic transducer system. The acoustic transducer system has the same directive pattern in reception as in transmission.

Figure 4:
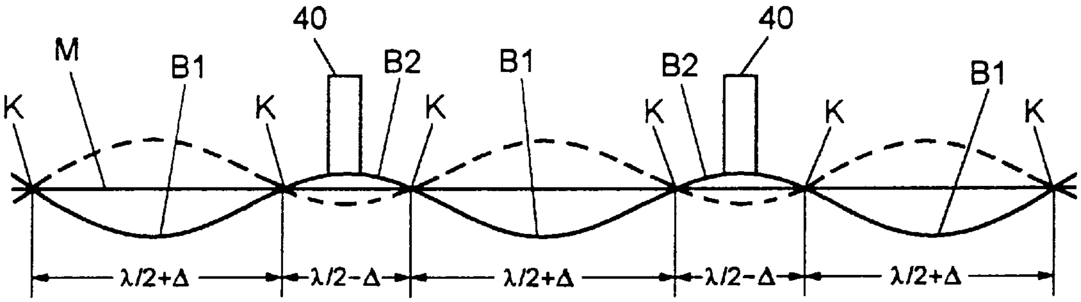
FIG. 4 is a schematic illustration for explaining the functioning of the flexural vibrating plate of the acoustic transducer system as shown in FIG. 1.

Referring now to FIG. 4 there is illustrated the vibration response of the flexural vibrating plate 30 provided with the mass rings 40 as shown in FIG. 1. The mass rings 40 are arranged so that in vibration at system operating frequency one mass ring 40 each is located in the middle of every second antinodal zone B2 whilst the first antinodal zones B1 are free of mass rings 40. Due to the additional mass the second antinodal zones B2 oscillate with a reduced amplitude about the center plane M of the flexural vibrating plate 30. The spacing between two nodal lines K between which a second antinodal zone B2 having a mass ring 40 is located is reduced to $\lambda/2-\Delta$, and the spacing between two nodal lines K between which a first antinodal zone B1 is located is correspondingly increased to $\lambda/2+\Delta$. This results in the first antinodal zones B1 oscillating with a substantially larger amplitude than the second antinodal zones B2 and accordingly the sound waves generated by the first antinodal zones B1 have a substantially larger amplitude than the sound waves generated by the second antinodal zones B2. The sound waves opposite in phase and parallel to each other are thus no longer able to fully cancel each other out; instead the sound waves stemming from the first antinodal zones B1 are attenuated only slightly whilst the sound waves stemming from the second antinodal zones B2 are totally suppressed. The result for the acoustic transducer system as shown in FIG. 1 is a sound radiation having pronounced directivity in the direction of the centerline A—A, i.e. perpendicular to the plane of the flexural vibrating plate 30.

The mass rings 40 need to be arranged equispaced so that the annular diaphragm sections of the first antinodal zones B1 located in between oscillate at the same resonance frequency and in phase. The resonance frequency may be varied by the ring spacing and the thickness of the plate. It must furthermore be assured that the center-spacing of the antinodal zones is smaller than the sound wavelength in air since otherwise additional side maxima materialize in the directional characteristic due to constructive interference of the sound waves stemming from the individual antinodal zones.

By slightly off-tuning individual annular diaphragm sections the radial amplitude distribution and thus the directional characteristic may be adapted to given requirements. For reducing the side maxima in the directional characteristic the distribution may be adapted, for example, to a Gaussian distribution or to a Kaiser-Bessel distribution.

In ranging in accordance with the pulsed echo sounding technique, as already explained, the acoustic transducer system is employed alternatingly as a transmitter and receiver. Due to ringing after emission of each sound pulse the acoustic transducer is unable to instantly operate as a receiver, i.e. a dead time materializes in which echo pulses of near targets cannot be received. The shortest measurable distance is termed the block distance. To shorten this block distance it is necessary to minimize ringing, which may be achieved by a corresponding damping arrangement. In the acoustic transducer system as shown in FIG. 1 this damping is achieved to advantage by the mass rings 40 applied to the rear side 30*b* of the flexural vibrating plate 30 being partly embedded in the potting compound 42 having high damping, thus substantially improving the pulse response of the acoustic transducer system and significantly reducing ringing.

Figure 5:
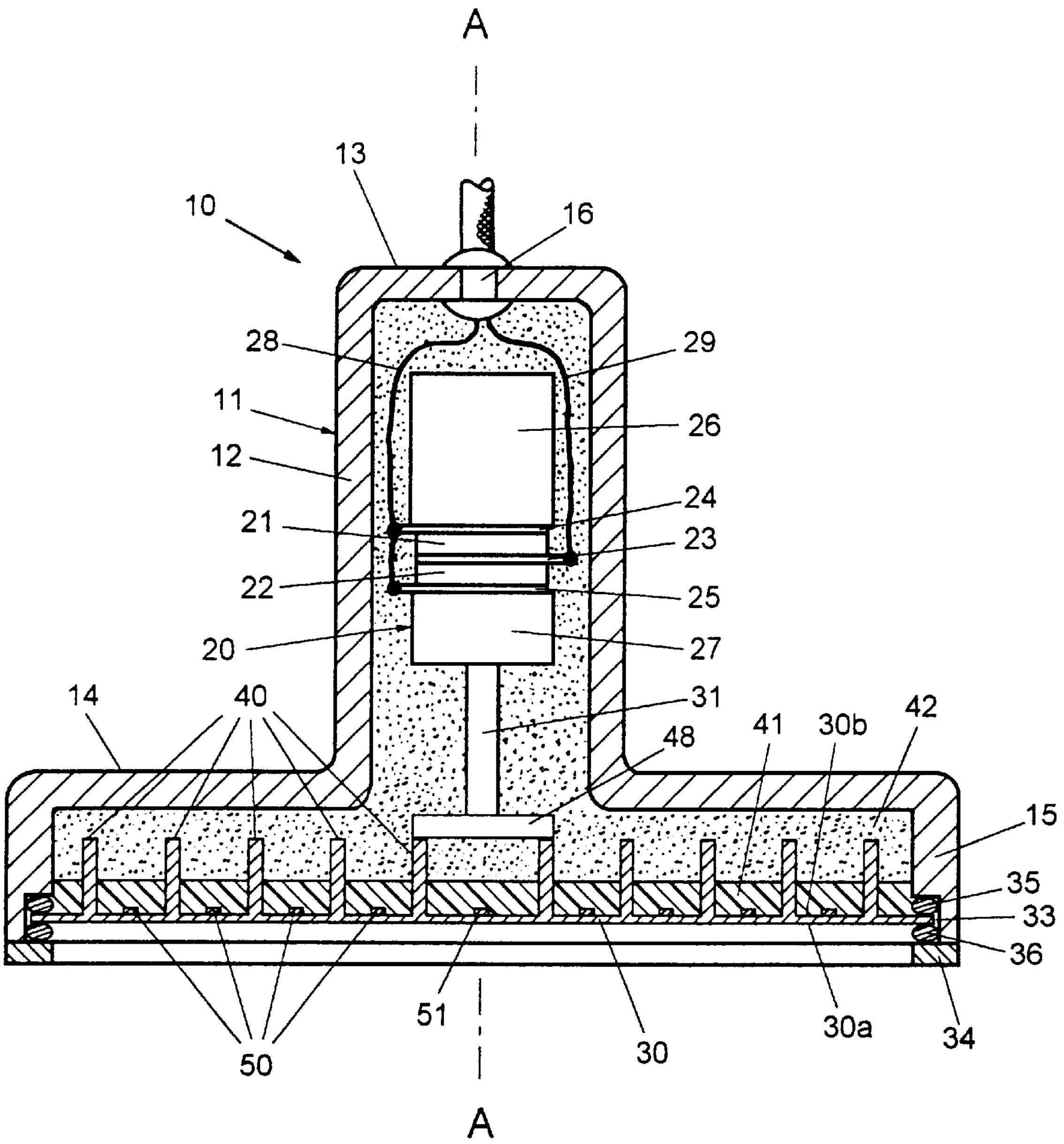
FIG. 5 is an illustration of a modified embodiment of the acoustic transducer system as shown in FIG. 1.

Referring now to FIG. 5 there is illustrated a modified embodiment of the acoustic transducer system as shown in FIG. 1. As compared to the acoustic transducer system as shown in FIG. 1 there is firstly the difference that the electromechanical transducer 20 is connected to the flexural vibrating plate 30 not via a bushing arranged in the center of the flexural vibrating plate 30 but via the innermost mass ring 40. For this purpose a coupling part 48 is applied to the end of the rod 31, this part being connected to the face side of the innermost mass ring 40 facing away from the flexural vibrating plate 30. Accordingly, stimulating the flexural vibrating plate 30 into vibration occurs in a second antinodal zone B2 and not, as shown in the embodiment illustrated in FIG. 1, in a first antinodal zone B1. Since the second antinodal zones B2 oscillate with an amplitude smaller than that of the first antinodal zones B1, this kind of stimulation automatically results in a transformation in amplitude and thus in a higher efficiency of the acoustic transducer system. Since all mass rings 40 vibrate in phase and with the same amplitude, it is also possible to connect the electromechanical transducer 20 via the coupling part 48 to several mass rings 40.

A further difference as compared to the embodiment as shown in FIG. 1 is that in the case of the embodiment as shown in FIG. 5 a mass ring 50 is likewise applied to the rear side 30*b* of the flexural vibrating plate 30 in each first antinodal zone which in the central antinodal zone is shrunk to a mass disk 51. The mass rings 50 and the mass disk 51 have a mass which is very much smaller than that of each mass ring 40. These additional small mass parts 50, 51 permit tuning the resonance frequency of the annular diaphragm sections forming the first antinodal zones.

Both means by which the embodiment as shown in FIG. 5 differs from the embodiment as shown in FIG. 1. are independent of each other, i.e. stimulating the flexural vibrating plate 30 via the mass rings 40 may also be done in the absence of the mass parts 50, 51, and, on the other hand, mass rings of the kind of mass rings 50 may also be applied to the embodiment as shown in FIG. 1.

In all cases the acoustic transducer system is characterized by the face side of the acoustic transducer system exposed to the environment being formed exclusively by the smooth and flat front side of the flexural vibrating plate 30 whilst all means for influencing sound radiation are arranged on the rear side of the flexural vibrating plate protected from the environment, thus making the acoustic transducer system highly insensitive to soilage, encrustations and the effects of aggressive media.

What is claimed is:

1. An acoustic transducer system including an electromechanical transducer, a circular flexural vibrating plate coupled to said electromechanical transducer and so configured that it is stimulated to higher order flexural vibration at the system operating frequency, at which nodal lines form on said flexural vibrating plate between which first and second antinodal zones are located oscillating alternatingly opposite in phase so that said flexural vibrating plate emits sound waves into a transmission medium bordering one side of said flexural vibrating plate or is stimulated to flexural vibration by sound waves arriving via said transmission medium, and including means for influencing the sound radiation by said flexural vibrating plate, characterized in that in the second antinodal zones oscillating in phase with respect to each other and opposite in phase in relation to the first antinodal zones one mass ring each is arranged on the rear side of said flexural vibrating plate facing away from said transmission medium concentrically to the centerpoint of said flexural vibrating plate.

2. The acoustic transducer system as set forth in claim 1, characterized in that in each first antinodal zone on the rear side of said flexural vibrating plate facing away from said transmission medium a mass ring is arranged concentric to said centerpoint of said flexural vibrating plate, the mass of said mass ring being substantially smaller than the mass of each mass ring arranged in a second antinodal zone.

3. The acoustic transducer system as set forth in claim 1, characterized in that said mass rings are made of metal.

4. The acoustic transducer system as set forth in claim 3, characterized in that said mass rings are configured integrally with said flexural vibrating plate.

5. The acoustic transducer system as set forth in claim 1, characterized in that the space adjoining the rear side of said flexural vibrating plate is filled with a high-damping potting compound in which said mass rings arranged in said second antinodal zones are embedded at least in part.

6. The acoustic transducer system as set forth in claim 5, characterized in that the sections of said rear side of said flexural vibrating plate not covered by said mass rings are covered by an expanded material, the thickness of which is less than the height of said mass rings and which prevents said potting compound from coming into direct contact with said flexural vibrating plate.

7. The acoustic transducer system as set forth in claim 1, characterized in that said electromechanical transducer is directly coupled to said flexural vibrating plate at the center thereof.

8. The acoustic transducer system as set forth in claim 1, characterized in that said electromechanical transducer is coupled to said flexural vibrating plate via at least one of said mass rings.

9. The acoustic transducer system as set forth in claim 2, characterized in that said mass rings are made of metal.

10. The acoustic transducer system as set forth in claim 2, characterized in that the space adjoining the rear side of said flexural vibrating plate is filled with a high-damping potting compound in which said mass rings arranged in said second antinodal zones are embedded at least in part.

11. The acoustic transducer system as set forth in claim 3, characterized in that the space adjoining the rear side of said flexural vibrating plate is filled with a high-damping potting compound in which said mass rings arranged in said second antinodal zones are embedded at least in part.

12. The acoustic transducer system as set forth in claim 4, characterized in that the space adjoining the rear side of said flexural vibrating plate is filled with a high-damping potting compound in which said mass rings arranged in said second antinodal zones are embedded at least in part.

13. The acoustic transducer system as set forth in claim 2, characterized in that said electromechanical transducer is directly coupled to said flexural vibrating plate at the center thereof.

14. The acoustic transducer system as set forth in claim 3, characterized in that said electromechanical transducer is directly coupled to said flexural vibrating plate at the center thereof.

15. The acoustic transducer system as set forth in claim 4, characterized in that said electromechanical transducer is directly coupled to said flexural vibrating plate at the center thereof.

16. The acoustic transducer system as set forth in claim 5, characterized in that said electromechanical transducer is directly coupled to said flexural vibrating plate at the center thereof.

17. The acoustic transducer system as set forth in claim 6, characterized in that said electromechanical transducer is directly coupled to said flexural vibrating plate at the center thereof.

18. The acoustic transducer system as set forth in claim 2, characterized in that said electromechanical transducer is coupled to said flexural vibrating plate via at least one of said mass rings.

19. The acoustic transducer system as set forth in claim 3, characterized in that said electromechanical transducer is coupled to said flexural vibrating plate via at least one of said mass rings.

20. The acoustic transducer system as set forth in claim 4, characterized in that said electromechanical transducer is coupled to said flexural vibrating plate via at least one of said mass rings.

21. The acoustic transducer system as set forth in claim 5, characterized in that said electromechanical transducer is coupled to said flexural vibrating plate via at least one of said mass rings.

22. The acoustic transducer system as set forth in claim 6, characterized in that said electromechanical transducer is coupled to said flexural vibrating plate via at least one of said mass rings.

* * * * *

UNITED STATES PATENT AND TRADEMARK OFFICE

CERTIFICATE OF CORRECTION

PATENT NO. : 6,081,064

DATED : June 27, 2000

INVENTOR(S) : Helmut Pfeiffer, Gerold Klotz-Engmann, Karl Flögel

It is certified that error appears in the above-indentified patent and that said Letters Patent is hereby corrected as shown below:

On the title page, item [56],

The following references are added to the References Cited section for this patent:

| | | | |
|---|---|---|---|
| 5,309,411 | 05/03/94 | Huang et al. | 367/140 |
| 08289397 | 11/01/96 | Japan | H04R 17/00 |

Signed and Sealed this

Third Day of April, 2001

Attest:

NICHOLAS P. GODICI

*Attesting Officer*

*Acting Director of the United States Patent and Trademark Office*